(12) United States Patent
Wang et al.

(10) Patent No.: US 10,541,233 B2
(45) Date of Patent: Jan. 21, 2020

(54) DISPLAY DEVICE

(71) Applicants:Industrial Technology Research Institute, Hsinchu (TW); Macroblock, Inc., Hsinchu (TW)

(72) Inventors: Po-Hsun Wang, Kaohsiung (TW); Chia-Hsin Chao, Hsinchu County (TW); Ming-Hsien Wu, Tainan (TW); Yen-Hsiang Fang, New Taipei (TW); Chien-Chung Lin, Taipei (TW); Ming-Jer Kao, Hsinchu County (TW); Feng-Pin Chang, Miaoli County (TW)

(73) Assignees: Industrial Technology Research Institute, Hsinchu (TW); Macroblock, Inc., Hsinchu (TW)

( * ) Notice: Subject to any disclaimer, the term of this patent is extended or adjusted under 35 U.S.C. 154(b) by 0 days.

(21) Appl. No.: 15/935,069

(22) Filed: Mar. 26, 2018

(65) Prior Publication Data
US 2019/0198483 A1   Jun. 27, 2019

(30) Foreign Application Priority Data
Dec. 22, 2017   (TW) .............................. 106145199 A

(51) Int. Cl.
*H01L 33/54* (2010.01)
*H01L 25/075* (2006.01)
(Continued)

(52) U.S. Cl.
CPC ...... *H01L 25/0753* (2013.01); *H01L 23/5386* (2013.01); *H01L 33/54* (2013.01); *H01L 33/60* (2013.01); *H01L 33/62* (2013.01)

(58) Field of Classification Search
None
See application file for complete search history.

(56) References Cited

U.S. PATENT DOCUMENTS 6,097,464 A * 8/2000 Liu .................... G02F 1/1393
349/122
6,476,896 B1 * 11/2002 Liu .................. G02F 1/133753
349/121
(Continued)

FOREIGN PATENT DOCUMENTS

CN   103872089   6/2014
CN   104392676   3/2015
(Continued)

OTHER PUBLICATIONS

"Office Action of Taiwan Counterpart Application," dated Aug. 14, 2018, pp. 1-11.
(Continued)

*Primary Examiner* — Bilkis Jahan
(74) *Attorney, Agent, or Firm* — JCIPRNET

(57) ABSTRACT

A display device including a circuit substrate, a plurality of pixels, and a light-shielding layer is provided. The pixels include a plurality of light-emitting elements. The light-emitting elements are disposed on the circuit substrate and are electrically connected to the circuit substrate. The light-emitting elements in the pixels are arranged along an arrangement direction. The light-shielding layer is disposed on the circuit substrate and has a plurality of pixel apertures. The pixels are disposed in a corresponding pixel aperture. The light-shielding layer includes a plurality of first light-shielding patterns extending in the arrangement direction and a plurality of second light-shielding patterns connected to the first light-shielding patterns. The extending direction of the second light-shielding patterns is different from the extending direction of the first light-shielding patterns. A thickness of the first light-shielding patterns is greater than or substantially equal to a thickness of the second light-shielding patterns.

18 Claims, 5 Drawing Sheets

(51) Int. Cl.
*H01L 23/538* (2006.01)
*H01L 33/62* (2010.01)
*H01L 33/60* (2010.01)

(56) References Cited

U.S. PATENT DOCUMENTS

| | | | |
|---|---|---|---|
| 6,573,965 B1 * | 6/2003 | Liu | G02F 1/133707 |
| | | | 349/129 |
| 7,130,011 B2 * | 10/2006 | Hsieh | G02F 1/133707 |
| | | | 349/141 |
| 7,872,723 B2 | 1/2011 | Fan-Jiang et al. | |
| 8,791,474 B1 | 7/2014 | Bibl et al. | |
| 8,981,391 B2 | 3/2015 | Lin et al. | |
| 9,214,503 B2 | 12/2015 | So et al. | |
| 9,356,179 B2 | 5/2016 | Wu et al. | |
| 9,691,828 B2 * | 6/2017 | Jiao | H01L 51/5268 |
| 2004/0218390 A1 * | 11/2004 | Holman | G02B 5/045 |
| | | | 362/245 |

FOREIGN PATENT DOCUMENTS

| | | |
|---|---|---|
| CN | 205264271 | 5/2016 |
| CN | 106486026 | 3/2017 |
| CN | 206340544 | 7/2017 |
| JP | 2017-073411 | 4/2017 |
| TW | I483226 | 5/2015 |
| TW | I557702 | 11/2016 |
| TW | M549957 | 10/2017 |

OTHER PUBLICATIONS

Francis Nguyen, "Challenges in the design of a RGB LED display for indoor applications," Synthetic Metals, vol. 122, Issue 1, May 2001, pp. 215-219.

* cited by examiner

DISPLAY DEVICE

CROSS-REFERENCE TO RELATED APPLICATION

This application claims the priority benefit of Taiwan application serial no. 106145199, filed on Dec. 22, 2017. The entirety of the above-mentioned patent application is hereby incorporated by reference herein and made a part of this specification.

BACKGROUND

Technical Field

The disclosed embodiments relate to a display device, and particularly to a display device having better displaying quality and fabrication yield rate.

Description of Related Art

Light emitting diodes (LEDs) have advantages in long lifetime, small volume, high shock-resistance, low heat-generation, low power-consumption, etc. Light emitting diodes are thus broadly applied in the indicators and light sources of home devices and a variety of other devices. In recent years, light emitting diodes have advanced to be of multiple colors and high brightness. The applied field of light emitting diodes is thus widened to cover large outdoor billboards, traffic lights and traffic signs, and other related fields. In the future, light emitting diodes might even become the main light source that is both power-saving and eco-friendly.

In ordinary display devices that employ light emitting diodes, the light emitting diodes may usually be disposed on a circuit substrate with surface-mounted-devices (SMD) or chip-on-board (COB) configuration. In the surface-mounted-devices configuration, however, at least a group of light-emitting elements capable of emitting red light, green light, and blue light are usually encapsulated in a frame. It could lead to chromatic aberrations when the distances between the aforementioned light-emitting elements and the pixel boundary differ, further resulting in low displaying quality. Additionally, in the chip-on-board configuration, it is rather difficult to substitute the dysfunctional or poorly-functioning light-emitting elements in situ through rework process since the wafers of the light-emitting elements are smaller and lack structures for pickup. The fabrication yield rate of display devices thus decreases. One of the methods for increasing the fabrication yield rate of the display devices is to install extra redundant light-emitting elements. Such method, however, leads to over-costing in production. Hence, further increasing the fabrication yield rate and displaying quality of display devices without over-costing to enhance the definition of display devices is now a problem awaits to be solved.

SUMMARY

A display device having better displaying quality and fabrication yield rate is provided in an exemplary embodiment of the disclosure.

A display device in an exemplary embodiment of the disclosure includes a circuit substrate, a plurality of pixels, and a light-shielding layer. Each of the plurality of pixels includes a plurality of light-emitting elements, wherein the plurality of light-emitting elements are disposed on the circuit substrate and are electrically connected to the circuit substrate. The plurality of light-emitting elements in one of the plurality of pixels are arranged along an arrangement direction. The light-shielding layer is located on the circuit substrate and has a plurality of pixel apertures. At least one of the plurality of pixels is located in one of the plurality of pixel apertures. The light-shielding layer includes a plurality of first light-shielding patterns extending along the arrangement direction and a plurality of second light-shielding patterns connected to the plurality of first light-shielding patterns. An extending direction of the plurality of second light-shielding patterns is different from an extending direction of the plurality of first light-shielding patterns. The plurality of first light-shielding patterns have a first thickness, the plurality of second light-shielding patterns have a second thickness, and the first thickness is greater than the second thickness.

A display device in an exemplary embodiment of the disclosure includes a circuit substrate, a light-shielding layer, and at least one light-emitting element. The circuit substrate has a first surface. The light-shielding layer is located on the first surface and has a light-shielding top surface. A first thickness is defined between the light-shielding top surface and the first surface. The at least one light-emitting element disposed on the first surface has a light-emitting top surface. A light-emitting height exists between the light-emitting top surface and the first surface. An element gap exists between the at least one light-emitting element and the light-shielding layer. A ratio of the element gap to a difference between the first thickness and the light-emitting height is greater than 0.66.

Several exemplary embodiments accompanied with figures are described in detail below to further describe the disclosure in details.

In the accompanying drawings, some of the elements or film layers are magnified or minified for clarity. Moreover, digital values shown in the specification may include the digital values themselves and deviation values that are within an acceptable deviation range for people having general knowledge in art. The aforementioned deviation values may be one or a plurality of standard deviations in the producing or measuring process. Alternatively, the aforementioned deviation values may also be one or a plurality of numerical errors caused by the number of digits applied in the calculation or conversion process, the rounding of numbers, error propagation, or other factors.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
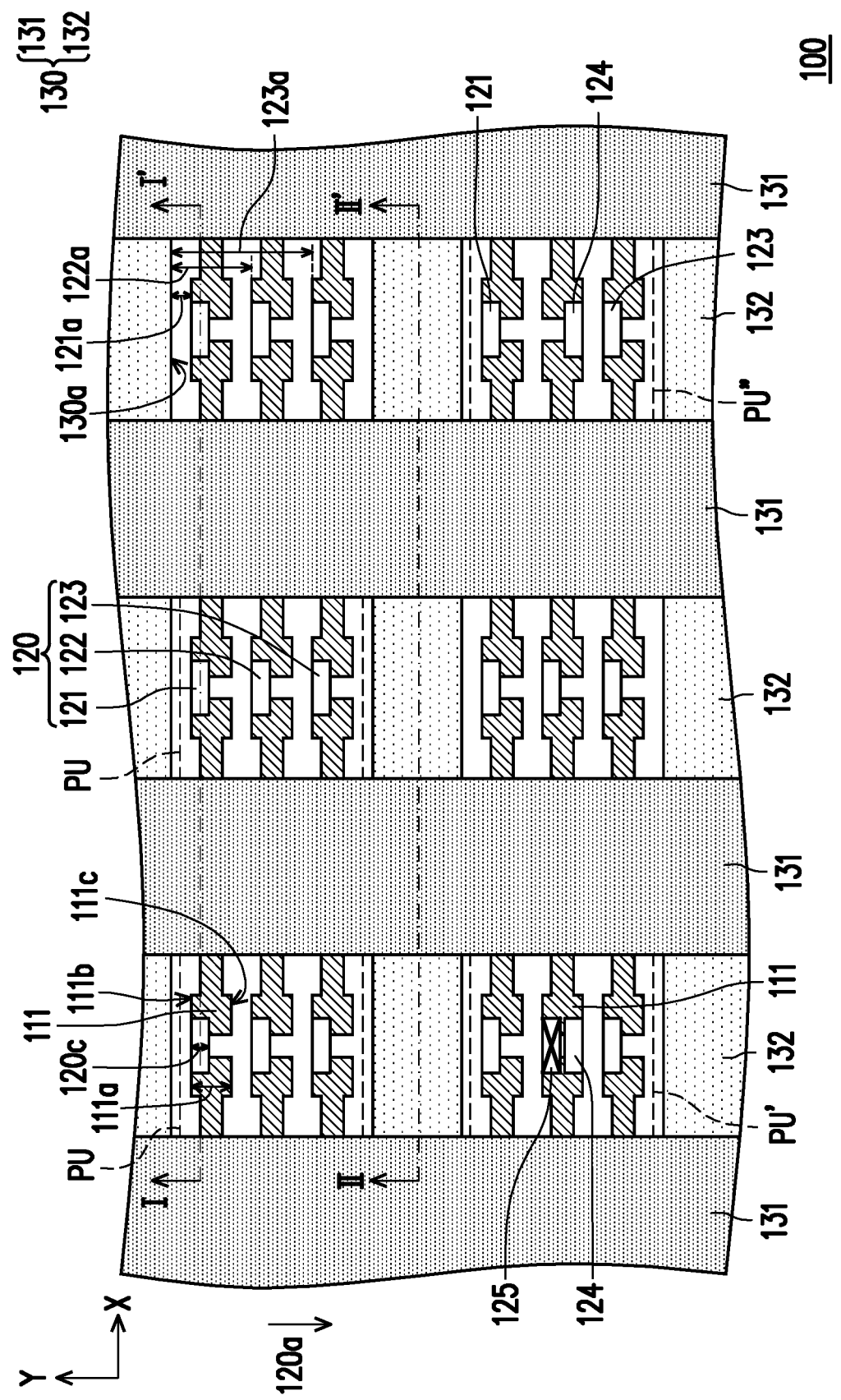
FIG. 1A is a top view of part of a display device according to a first exemplary embodiment.
Figure 1B:
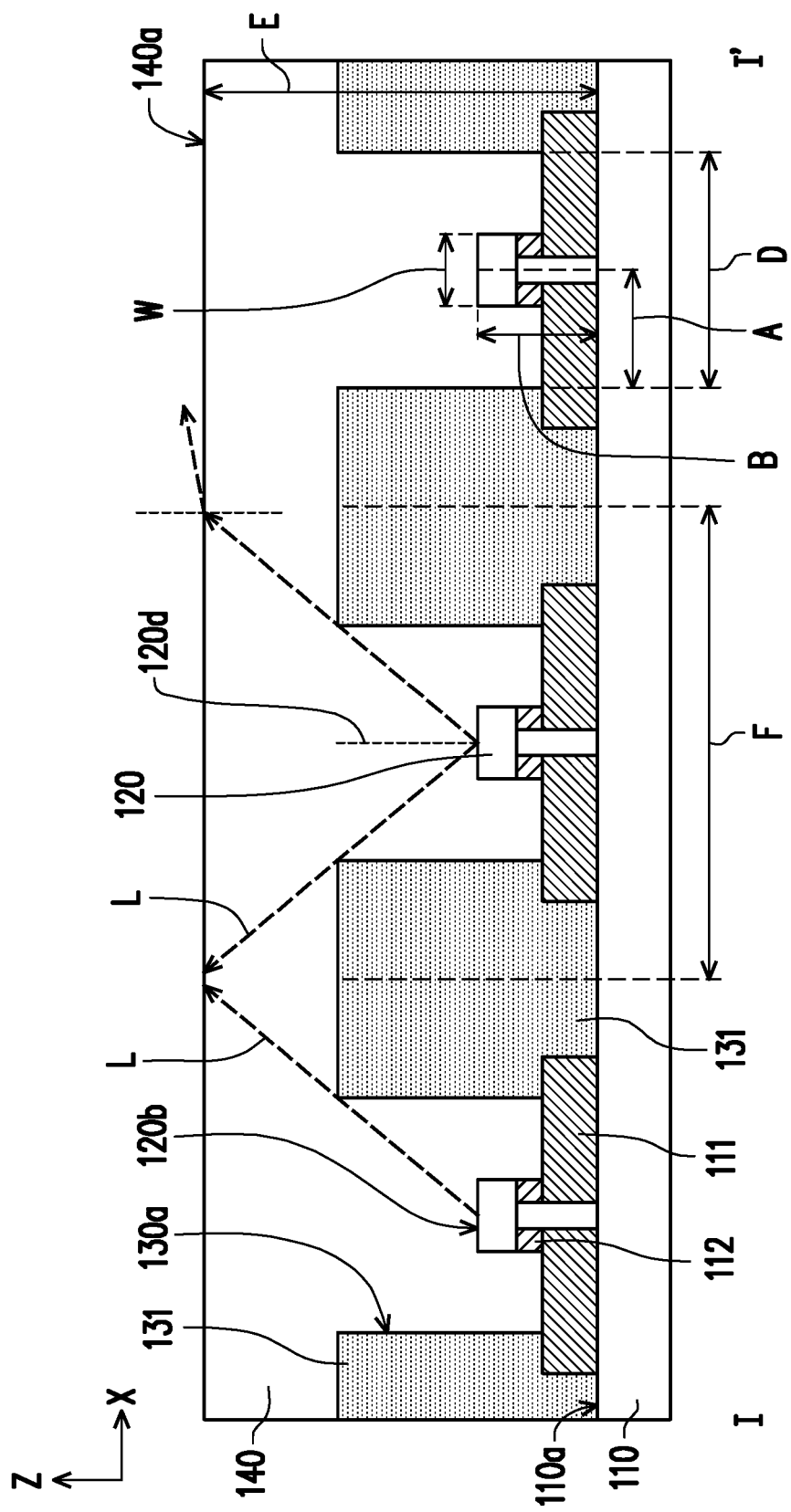
FIG. 1B is a cross-sectional view along an I-I' section line of FIG. 1A.
Figure 1C:
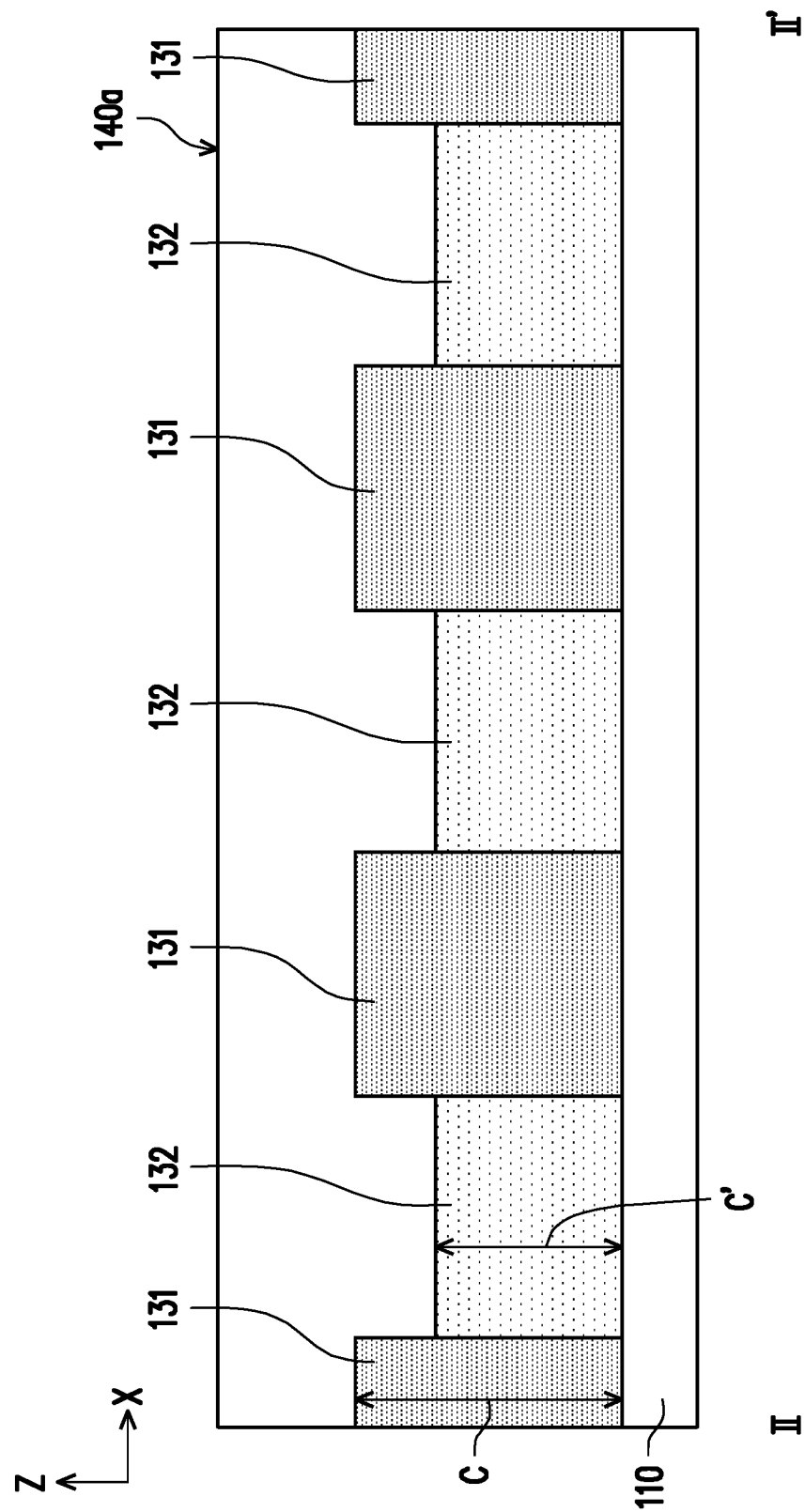
FIG. 1C is a cross-sectional view along an II-II' section line of FIG. 1A.

FIG. 1A is a top view of part of a display device according to a first exemplary embodiment. FIG. 1B is a cross-sectional view along an I-I' section line of FIG. 1A. FIG. 1C is a cross-sectional view along an II-II' section line of FIG. 1A. Some film layers are not illustrated in FIG. 1A for better clarity.

Referring to FIG. 1A to FIG. 1C altogether, a display device 100 according to the first embodiment includes a circuit substrate 110, a plurality of pixels PU, a light-shielding layer 130, and an encapsulating layer 140. The plurality of pixels PU, the light-shielding layer 130, and the encapsulating layer 140 are disposed on a first surface 110a of the circuit substrate 110. The encapsulating layer 140 covers of encapsulates the light-shielding layer 130 and the plurality of pixels PU.

In some embodiments, at least one or each one pixel PU among the plurality of pixels PU may respectively include a plurality of light-emitting elements 120. According to this exemplary embodiment, at least one or each one of the plurality of pixels PU may include a first light-emitting element 121, a second light-emitting element 122, and a third light-emitting element 123. The first light-emitting element 121, the second light-emitting element 122, and the third light-emitting element 123 may emit lights of different colors. The first light-emitting element 121, the second light-emitting element 122, and the third light-emitting element 123 in one of the plurality of pixels PU are arranged along an arrangement direction 120a. For example, the first light-emitting element 121 may emit a red light, the second light-emitting element 122 may emit a green light, and the third light-emitting element 123 may emit a blue light. The arrangement direction 120a of the first light-emitting element 121, the second light-emitting element 122, and the third light-emitting element 123 in one of the plurality of pixels PU is substantially parallel to the Y-axis direction. Nevertheless, embodiments of the disclosure are not limited thereto.

The plurality of light-emitting elements 120 are disposed on the circuit substrate 110 and are electrically connected to the circuit substrate 110. More specifically, the circuit substrate 110 may have a plurality groups of connecting pads 111 and the plurality of light-emitting elements 120 are disposed corresponding to a group of the plurality groups of connecting pads 111. According to this exemplary embodiment, the plurality of light-emitting elements 120 may be electrically connected to corresponding connecting pads 111 of the plurality groups of connecting pads 111 with use of a conductive connector 112 through flip chip bonding. The conductive connector 112 is, for example, a solder-ball. Nevertheless, embodiments of the disclosure are not limited thereto. According to this exemplary embodiment, each of the plurality of light-emitting elements 120 has a corresponding element width 120c in the arrangement direction 120a. Each group of the plurality groups of connecting pads 111 has a corresponding maximum width 111a. The maximum width of connecting pads 111a is greater than twice of the element width 120c. Apart from the above, each group of the plurality groups of connecting pads 111 has a first end 111b and a second end 111c opposite to each other in the arrangement direction 120a. The plurality of light-emitting elements 120 are disposed on one of the first end 111b and the second end 111c. According to the exemplary embodiment illustrated in FIG. 1A, the plurality of light-emitting elements 120 are disposed on a first end 111b of a corresponding group of the plurality groups of connecting pads 111. As a result, the other end of each group of the plurality groups of connecting pads 111 where the plurality of light-emitting elements 120 are not disposed (e.g. the second end 111c according to the exemplary embodiment illustrated in FIG. 1A) may be reserved for future repair.

According to this exemplary embodiment, at least one or each group of the plurality groups of connecting pads 111 may include two T-shaped conductive features. Nevertheless, embodiments of the disclosure are not limited thereto. In an alternative embodiment, at least one or each group of the plurality groups of connecting pads 111 may include two stripe shaped conductive features.

The light-shielding layer 130 may include a plurality of first light-shielding patterns 131 and a plurality of second light-shielding patterns 132. The plurality of first light-shielding patterns 131 extend along the arrangement direction 120a. An extending direction of the plurality of second light-shielding patterns 132 is different from an extending direction of the plurality of first light-shielding patterns 131. The plurality of first light-shielding patterns 131 have a first thickness C. The plurality of second light-shielding patterns 132 have a second thickness C'. The first thickness C is greater than or substantially equal to the second thickness C'. The plurality of first light-shielding patterns 131 and the plurality of second light-shielding patterns 132 are connected to one another, such that a plurality of pixel apertures 130a are formed in the light-shielding layer 130. The plurality of pixels PU are respectively located in corresponding pixel apertures 130a of the plurality of pixel apertures 130a. The light-shielding layer 130 may partially block light emitted by the plurality of light-emitting elements 120 in the plurality of pixel apertures 130a. According to this exemplary embodiment, a material of the light-shielding layer 130 may include a light-shielding solder-resist material. Nevertheless, embodiments of the disclosure are not limited thereto.

According to this exemplary embodiment, at least one or each of the plurality of pixels PU is respectively located in one pixel aperture 130a among the plurality of pixel apertures 130a. Nevertheless, embodiments of the disclosure are not limited thereto. In some alternative embodiments, more than one of the plurality of pixels PU may be located in one pixel aperture 130a among the plurality of pixel apertures 130a. In another alternative embodiment, some apertures 130a among the plurality of pixel apertures 130a may not have any pixel disposed therein. The plurality of pixel apertures 130a that do not have any of the plurality of pixels PU inside may be used for positioning, testing, or other appropriate producing processes.

According to this exemplary embodiment, the extending direction of the plurality of first light-shielding patterns 131 is different from the extending direction of the plurality of second light-shielding patterns 132. More than one (i.e. at least two) of the plurality of second light-shielding patterns 132 may exist between two adjacent first light-shielding patterns 131. In an alternative embodiment, the extending direction of the plurality of first light-shielding patterns 131 is substantially perpendicular to the extending direction of the plurality of second light-shielding patterns 132. For example, the plurality of first light-shielding patterns 131 extend in a direction substantially parallel to the Y-axis direction, while the plurality of second light-shielding patterns 132 extend in a direction substantially parallel to the X-axis direction. Nevertheless, embodiments of the disclosure are not limited thereto.

In one pixel PU among the plurality of pixels PU, distances between the plurality of light-emitting elements 120 and corresponding second light-shielding patterns 132 of the plurality of second light-shielding patterns 132 are different from one another. For example, in one pixel PU among the plurality of pixels PU and when corresponding to the same second light-shielding pattern 132 of the plurality of second light-shielding patterns 132, a distance between the first light-emitting element 121 and the second light-shielding pattern 132 is a first distance 121a, a distance between the second light-emitting element 122 and the second light-shielding pattern 132 is a second distance 122a, a distance between the third light-emitting element 123 and the second light-shielding pattern 132 is a third distance 123a. The first distance 121a, the second distance 122a, and the third distance 123a are different from one another. According to this exemplary embodiment, the third distance 123a is greater than the second distance 122a, and the second distance 122a is greater than the first distance 121a. Nevertheless, embodiments of the disclosure are not limited thereto.

Generally speaking, in two adjacent pixels PU among the plurality of pixels PU on two sides of the plurality of second light-shielding patterns 132, the first light-emitting element 121, the second light-emitting element 122, and the third light-emitting element 123 may be arranged in the same way. That is to say, in the two adjacent pixels PU, the first light-emitting element 121, the second light-emitting element 122, and the third light-emitting element 123 thereof are all arranged along the arrangement direction 120a. In other words, at least one of the plurality of second light-shielding patterns 132 and two light-emitting elements 120 of the plurality of light-emitting elements 120 emitting lights of different colors may be disposed between two light-emitting elements 120 of the plurality light-emitting elements 120 emitting lights of the same color which are located on two sides of the second light-shielding patterns 132. For example, at least one of the plurality of second light-shielding patterns 132, a second light-emitting element 122, and a third light-emitting element 123 may be disposed between two first light-emitting elements 121 which are located on two sides of the plurality of light-shielding patterns 132. Alternatively, at least one of the plurality of second light-shielding patterns 132, a first light-emitting element 121, and a third light-emitting element 123 may be disposed between two second light-emitting elements 122 which are located on two sides of the plurality of second light-shielding patterns 132. Still alternatively, at least one of the plurality of second light-shielding patterns 132, a first light-emitting element 121, and a second light-emitting element 122 may be disposed between two third light-emitting elements 123 which are located on two sides of the plurality of second light-shielding patterns 132. In addition, since a light-emitting height B defined between a light-emitting top surface 120b of each light-emitting element 120 and the first surface 110a is smaller than the second thickness C' of the plurality of second light-shielding patterns 132, optical crosstalk between two adjacent pixels PU among the plurality of pixels PU located on two sides of the plurality of second light-shielding patterns 132 may be reduced with such configuration and such height/width relationship. Additionally, since the second thickness C' of the plurality of second light-shielding patterns 132 is smaller than or substantially equal to the first thickness C of the plurality of first light-shielding patterns 131, chromatic aberrations of the display device 100 in the arrangement direction 120a may also be reduced.

In one pixel PU among the plurality of pixels PU, element gaps A between the plurality of light-emitting elements 120 and corresponding first light-shielding patterns 131 of the first light-shielding patterns 131 are substantially identical to one another. For example, in one pixel PU among the plurality of pixels PU and when corresponding to the same first light-shielding pattern 131 of the plurality of light-shielding patterns 131, the element gaps A may be a distance between the first light-emitting element 121 and the first light-shielding pattern 131, a distance between the second light-emitting element 122 and the first light-shielding pattern 131, or a distance between the third light-emitting element 123 and the first light-shielding pattern 131. Hence, chromatic aberration of the display device 100 in a direction (i.e. the X-axis direction) perpendicular to the arrangement direction 120a is reduced.

A pixel gap F is defined by median lines of two adjacent first light-shielding patterns 131 among the plurality of first light-shielding patterns 131. An encapsulating thickness E is defined between an encapsulating top surface 140a of the encapsulating layer 140 and the first surface 110a of the circuit substrate 110. According to geometrical proportion, when a ratio of the pixel gap F to a difference between the encapsulating thickness E and the light-emitting height B is greater than twice of a ratio of the element gaps A to a difference between the first thickness C and the light-emitting height B, a light L (i.e. a chief ray) emitted from a center normal line 120d of a light-emitting plane 120b of the plurality of light-emitting elements 120 cannot get across the plurality of first light-shielding patterns 131 so as to reach any sides in a direction (i.e. the X-axis direction) perpendicular to the arrangement direction 120a. Optical crosstalk is thus reduced. Equation (1-1) below may be used to represent the above relationship:

$$\frac{2 \times A}{C - B} < \frac{F}{E - B} \quad (1\text{-}1)$$

As a result, light crosstalk of the light L between two adjacent pixels PU among the plurality of the pixels PU located on two sides of the plurality of first light-shielding patterns 131 may be reduced.

Taking micro light-emitting diodes (μLEDs) as an example for the plurality of light-emitting elements 120, an element length W of the plurality of light-emitting elements 120 in a direction perpendicular to the arrangement direction 120a may be at least 5 micrometer (μm). Moreover, the pixel gap F formed by median lines of adjacent first light-shielding patterns 131 of the plurality of first light-shielding patterns 131 may be 2000 micrometer maximum. Additionally, the first thickness C of the plurality of first light-shielding patterns 131 may be 10.1 micrometer minimum. In addition, the light-emitting height B of the plurality of light-emitting elements 120 may be 10 micrometer maximum. With the aforementioned sizes, such proportion of similar triangles allows a ratio of the element gaps A to a difference between the first thickness C and the light-emitting height B to be smaller than 5000. Equation (1-2) below may be used to represent the above relationship:

$$\frac{A}{C - B} < \frac{(2000/2)}{(10.1 - 10)} = 5000 \quad (1\text{-}2)$$

Generally speaking, a material of the encapsulating layer 140 may be selected from one of epoxy resin, silicone resin, and a compound thereof. A refractive index of the encapsulating layer 140 may range from 1.4 to 1.8. Part of the light L, i.e. the chief ray, of the plurality of light-emitting elements 120 is almost totally reflected by and trapped inside of the encapsulating layer 140. According to the Snell's Law, a ratio of the element gaps A to a difference between the first thickness C and the light-emitting height B should be made to be greater than 0.66 such that the light L, i.e. the chief ray, is no further blocked by the plurality of first light-shielding patterns 131. Equation (2) below may be used to represent the above relationship:

$$\frac{A}{C-B} > \tan(\arcsin(1/1.8)) \cong 0.66 \qquad (2)$$

Apart from the above, under the aforementioned conditions, the encapsulating thickness E of the encapsulating layer 140 may be smaller than or substantially equal to 1506.61 micrometer, such that a possibility of optical crosstalk occurring between two adjacent light-emitting elements 120 among the plurality of light-emitting elements 120 located on two sides of the plurality of first light-shielding patterns 131 is reduced.

According to this exemplary embodiment, some of the plurality of pixels PU (e.g. a pixel PU') may further include a repair light-emitting element 124. The repair light-emitting element 124 and a light-emitting element 125 disposed on the same group of the plurality groups of connecting pads 111 emit lights of a same color. A location of the repair light-emitting element 124 and a location of the light-emitting element 125 are different. For example, in a pixel PU' on the same group among the plurality groups of connecting pads 111, the light-emitting element 125 is disposed on the first end 111b of the connecting pad 111, while the repair light-emitting element 124 is disposed on the second end 111c of the connecting pad 111. In a producing process of the display device 100, the repair light-emitting element 124 for repairing purpose may be directly disposed on the second end 111c of the connecting pad 111 in a configuration identical or similar to a configuration of the light-emitting element 125 when the light-emitting element 125 is dysfunctional or poorly functioning. As a result, the display device 100 may have better fabrication yield rate through rework.

It should be noted that according to the exemplary embodiment illustrated in FIG. 1A, an example is given on a number of pixels PU' and PU'' having the repair light-emitting element 124 being two and a number of the repair light-emitting element 124 being two. Nevertheless, a number of pixels having the repair light-emitting element 124 and a number of the repair light-emitting element 124 are not limited in embodiments of the disclosure. Additionally, in an alternative embodiment, dysfunctional or poorly-functioning light-emitting elements may be removed (e.g. in FIG. 1A, unlike other pixels PU of the plurality of pixels PU having the second light-emitting element 122, the pixel PU''' on the bottom right does not have any second light-emitting element 122 similar thereto but has the repair light-emitting element 124), such that a potential yield rate loss that may be further caused by dysfunctional or poorly-functioning light-emitting elements is reduced.

The configuration of the repair light-emitting element 124 is similar to the configuration of the light-emitting element 125 on the same group among the plurality of connecting pads 111. That is to say, the repair light-emitting element 124 and other light-emitting elements 120 of the plurality of light-emitting elements 120 in the pixels PU' and PU'' are arranged along the arrangement direction 120a. In addition, comparing with the distance (i.e. the element gaps A) between the plurality of light-emitting elements 120 and the plurality of first light-shielding patterns 131, the distance between the repair light-emitting element 124 and the plurality of first light-shielding patterns 131 and the aforementioned distances (i.e. the element gaps A) are substantially identical.

Figure 2:
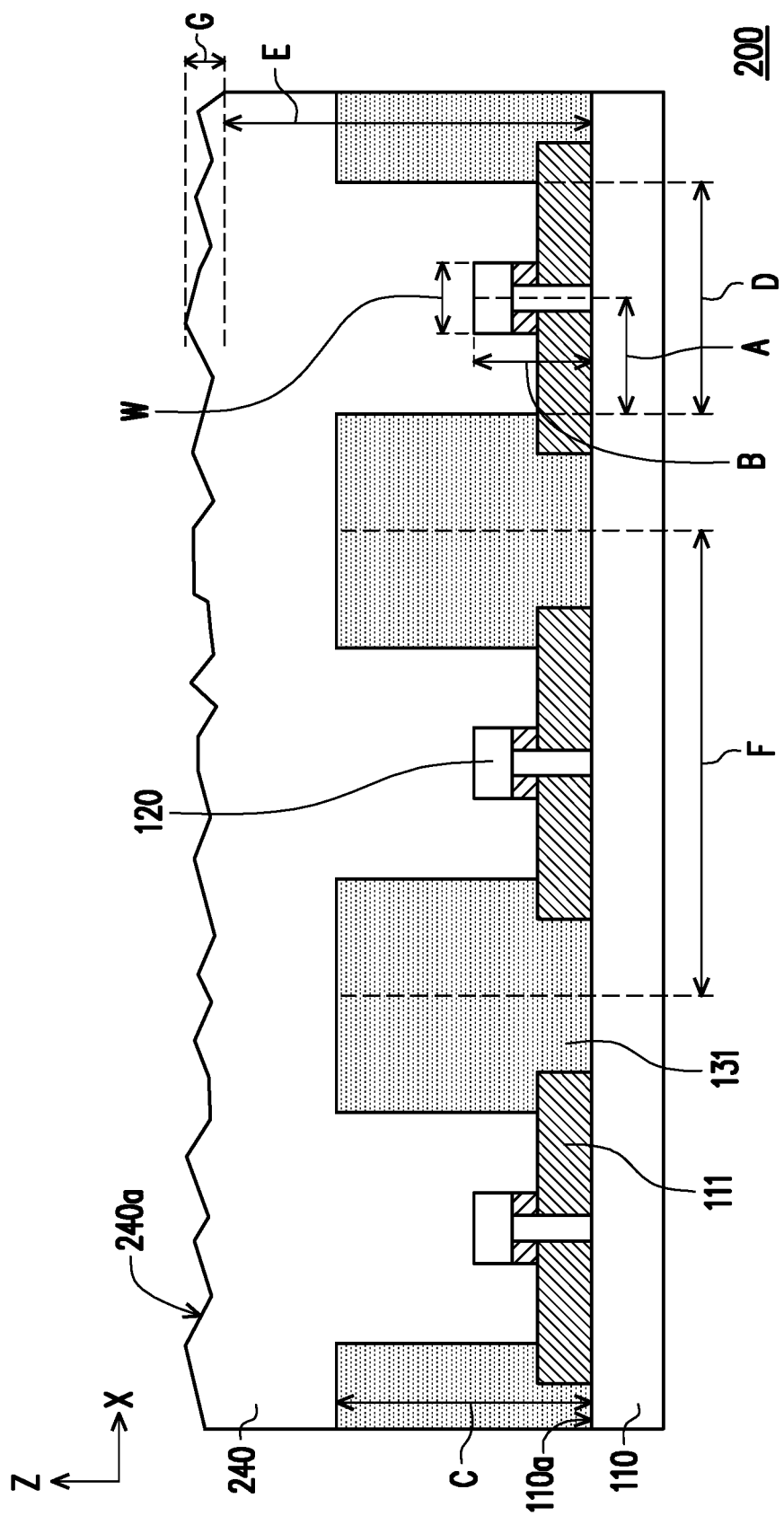
FIG. 2 is a cross-sectional view of part of a display device according to a second exemplary embodiment.

FIG. 2 is a cross-sectional view of part of a display device according to a second exemplary embodiment. It should be explained that the reference numerals and some content of the exemplary embodiment illustrate in FIG. 1A to FIG. 1C are continued to be used in the exemplary embodiment illustrated in FIG. 2, wherein identical or similar reference numerals are employed to represent identical or similar elements, and descriptions on the same technical content are omitted. Please refer to the exemplary embodiment illustrated in FIG. 1A to FIG. 1C for the omitted descriptions for they are not repeated again hereinafter.

Referring to FIG. 2, a display device 200 according to this exemplary embodiment is similar to the display device 100 according to the exemplary embodiment illustrated in FIG. 1A to FIG. 1C. The display device 200 and the display device 100 are similar except that an encapsulating top surface 240a of an encapsulating layer 240 is a rough surface. In a normal line direction (i.e. the Z-axis direction) of the first surface 110a, a distance between a highest point and a lowest point on the encapsulating top surface 240a is a surface roughness G. An encapsulating thickness E of the encapsulating layer 240 may be greater than ten times of the surface roughness G. As a result, haze of the display device 200 may be reduced and a displaying quality of the display device 200 may thus be enhanced.

Generally speaking, a rough surface may be used to reduce total reflection effect to enhance output efficiency of a display. Surfaces that are overly rough, however, result in a messy distribution of luminance. Images on a display device thus appear to be fragmental from certain viewing angles. Proper and mild haze is thus required. According to this exemplary embodiment, the encapsulating thickness E of the encapsulating layer 240 may be made to be greater than ten times of the surface roughness G, such that the total reflection effect is reduced and the output efficiency is enhanced. The display device 200 may provide excellent displaying quality.

Figure 3:
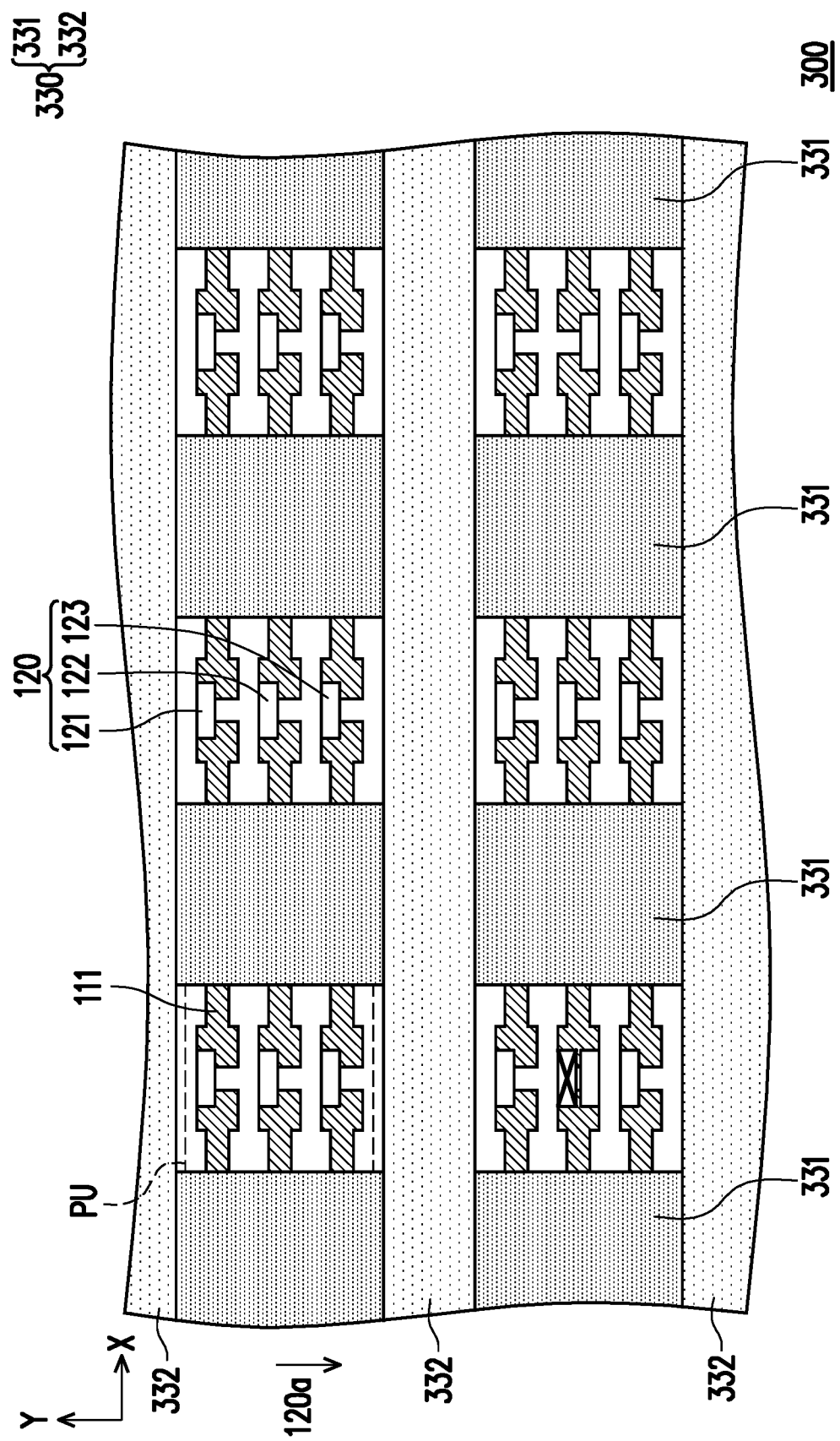
FIG. 3 is a top view of part of a display device according to a third exemplary embodiment.

FIG. 3 is a top view of part of a display device according to a third exemplary embodiment. It should be explained that the reference numerals and some content of the exemplary embodiment illustrate in FIG. 1A to FIG. 1C are continued to be used in the exemplary embodiment illustrated in FIG. 3, wherein identical or similar reference numerals are employed to represent identical or similar elements, and descriptions on the same technical content are omitted. Please refer to the exemplary embodiment illustrated in FIG. 1A to FIG. 1C and FIG. 2 for the omitted descriptions for they are not repeated again hereinafter.

Referring to FIG. 3, a display device 300 according to this exemplary embodiment is similar to the display device 100 according to the exemplary embodiment illustrated in FIG. 1A to FIG. 1C. The display device 300 and the display device 100 are similar except that an extending direction of a plurality of first light-shielding patterns 331 is different from an extending direction of a plurality of second light-shielding patterns 332, and more than one (i.e. at least two) of the plurality of first light-shielding patterns 331 are disposed between two adjacent second light-shielding patterns 332 of the plurality of second light-shielding patterns 332. In an exemplary embodiment, an extending direction of the plurality of first light-shielding patterns 331 is substantially perpendicular to an extending direction of the plurality of second light-shielding patterns 332. For example, the plurality of first light-shielding patterns 331 may extend in a direction substantially parallel to the Y-axis direction. The plurality of second light-shielding patterns 332 may extend in a direction substantially parallel to the X-axis direction.

In conclusion of the above, in the plurality of pixels of the disclosed display device, the plurality of light-emitting elements of at least one of the plurality of pixels are arranged along the arrangement direction. The plurality of first light-shielding patterns extend along the arrangement direction. The extending direction of the plurality of second light-shielding patterns is different from the extending direction of the plurality of first light-shielding patterns. The thickness of the plurality of first light-shielding patterns is greater than or substantially equal to the thickness of the plurality of second light-shielding patterns. As a result, the output efficiency and viewing angles of the display device are enhanced in a direction perpendicular to the arrangement direction. In addition, chromatic aberrations of the display device are reduced in the arrangement direction. Moreover, dispositions of the plurality of first light-shielding patterns and/or the plurality of second light-shielding patterns may reduce optical crosstalk between the plurality of pixels. Hence, the display device has better displaying quality.

Although the embodiments are already disclosed as above, these embodiments should not be construed as limitations on the scope of the disclosure. It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display device, comprising:
    a circuit substrate;
    a plurality of pixels each including a plurality of light-emitting elements, wherein the plurality of light-emitting elements are disposed on the circuit substrate and electrically connected to the circuit substrate, the plurality of light-emitting elements in one of the plurality of pixels are arranged along an arrangement direction; and
    a light-shielding layer located on the circuit substrate and having a plurality of pixel apertures, wherein at least one pixel of the plurality of pixels is located in one of the plurality of pixel apertures, the light-shielding layer comprises a plurality of first light-shielding patterns arranged along the arrangement direction and a plurality of second light-shielding patterns connected to the first light-shielding patterns, an extending direction of the plurality of second light-shielding patterns is different from an extending direction of the plurality of first light-shielding patterns, the plurality of first light-shielding patterns have a first thickness, the plurality of second light-shielding patterns have a second thickness, and the first thickness is greater than or substantially equal to the second thickness.

2. The display device according to claim 1, wherein the circuit substrate has a plurality groups of connecting pads, the plurality of light-emitting elements in one of the plurality of pixels are disposed corresponding to one of the plurality groups of connecting pads, wherein each of the plurality of light-emitting elements has an element width in the arrangement direction, each of the plurality groups of connecting pads has a maximum width of connecting pads, and the maximum width of connecting pads is greater than twice of the element width.

3. The display device according to claim 2, wherein one of the plurality of pixels further comprising:
    at least one repair light-emitting element disposed corresponding to one of the plurality groups of connecting pads, wherein the at least one repair light-emitting element and one of the plurality of light-emitting elements disposed on a same connecting pad of the plurality groups of connecting pads capable of emitting a same color light.

4. The display device according to claim 3, wherein the at least one repair light-emitting element and one of the plurality of light-emitting elements disposed on a same connecting pad of the plurality groups of connecting pads have a same gap with a corresponding first light-shielding pattern of the plurality of first light-shielding patterns.

5. The display device according to claim 1, wherein at least two of the plurality of second light-shielding patterns are between adjacent first light-shielding patterns of the plurality of first light-shielding patterns.

6. The display device according to claim 1, wherein at least two of the plurality of first light-shielding patterns are between adjacent second light-shielding patterns of the plurality of second light-shielding patterns.

7. The display device according to claim 1, wherein the circuit substrate has a first surface, the plurality of light-emitting elements have a light-emitting top surface, a light-emitting height is defined between the light-emitting top surface and the first surface, and both the first thickness and the second thickness are greater than the light-emitting height.

8. The display device according to claim 7, wherein an element gap is defined between the plurality of light-emitting elements and corresponding first light-shielding patterns of the plurality of first light-shielding patterns, and a ratio of the element gap to a difference between the first thickness and the light-emitting height is greater than 0.66.

9. The display device according to claim 8, wherein a ratio of the element gap to a difference between the first thickness and the light-emitting height is smaller than 5000.

10. The display device according to claim 1, wherein the circuit substrate has a first surface, and the display device further comprises:
    an encapsulating layer encapsulating the light-shielding layer and the plurality of light-emitting elements, the encapsulating layer has an encapsulating top surface, and an encapsulating thickness is defined between the encapsulating top surface and the first surface, wherein the encapsulating thickness is greater than the first thickness.

11. The display device according to claim 10, wherein the plurality of light-emitting elements have a light-emitting top surface, a light-emitting height is defined between the light-emitting top surface and the first surface, a pixel gap is defined between adjacent first light-shielding patterns of the plurality of first light-shielding patterns, an element gap is defined between the plurality of light-emitting elements and corresponding first light-shielding patterns of the plurality of first light-shielding patterns, and a ratio of the pixel gap to a difference between the encapsulating thickness and the light-emitting height is greater than twice of a ratio of the element gap to a difference between the first thickness and the light-emitting height.

12. The display device according to claim 10, wherein the encapsulating top surface of the encapsulating layer has surface roughness, and the encapsulating thickness is greater than 10 times of the surface roughness.

13. The display device according to claim 1, wherein distances between the plurality of light-emitting elements and corresponding second light-shielding patterns of the plurality of second light-shielding patterns are different from one another.

14. The display device according to claim 1, wherein a material of the light-shielding layer comprises a solder-resist material.

15. A display device, comprising:
a circuit substrate having a first surface;
a light-shielding layer located on the first surface and having a light-shielding top surface, and a first thickness is defined between the light-shielding top surface and the first surface;
a light-emitting element disposed on the first surface and having a light-emitting top surface, a light-emitting height is defined between the light-emitting top surface and the first surface, an element gap is defined between the light-emitting element and the light-shielding layer, and a ratio of the element gap to a difference between the first thickness and the light-emitting height is greater than 0.66; and an encapsulating layer encapsulating on the light-shielding layer and the light-emitting element, the encapsulating layer has an encapsulating top surface, and an encapsulating thickness is defined between the encapsulating top surface and the first surface, wherein the encapsulating thickness is greater than the first thickness, wherein a pixel gap is defined in the light-shielding layer located on two opposite sides of the light-emitting element, wherein a ratio of the pixel gap to a difference between the encapsulating thickness and the light-emitting height is greater than twice of a ratio of the element gap to a difference between the first thickness and the light-emitting height.

16. The display device according to claim 15, wherein the first thickness is greater than the light-emitting height.

17. The display device according to claim 15, wherein the ratio of the element gap to the difference between the first thickness and the light-emitting height is smaller than 5000.

18. The display device according to claim 15, wherein the encapsulating top surface of the encapsulating layer has surface roughness, and the encapsulating thickness is greater than 10 times of the surface roughness.

* * * * *